United States Patent
Phillips et al.

(10) Patent No.: US 11,595,034 B2
(45) Date of Patent: Feb. 28, 2023

(54) FAULT VOLTAGE SCALING ON LOAD SWITCH CURRENT SENSE

(71) Applicant: TEXAS INSTRUMENTS INCORPORATED, Dallas, TX (US)

(72) Inventors: Cameron Wayne Phillips, Red Oak, TX (US); Wenchao Qu, Plano, TX (US); Tianhong Yang, Dallas, TX (US); Md Abidur Rahman, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/538,547

(22) Filed: Nov. 30, 2021

(65) Prior Publication Data

US 2022/0385282 A1 Dec. 1, 2022

Related U.S. Application Data

(60) Provisional application No. 63/193,490, filed on May 26, 2021.

(51) Int. Cl.
*H03K 17/0412* (2006.01)
*H03K 17/693* (2006.01)
*H03K 17/082* (2006.01)

(52) U.S. Cl.
CPC ..... *H03K 17/04123* (2013.01); *H03K 17/693* (2013.01); *H03K 17/0822* (2013.01)

(58) Field of Classification Search
CPC .......... H03K 17/04123; H03K 17/693; H03K 17/0822
See application file for complete search history.

(56) References Cited

U.S. PATENT DOCUMENTS

| | | | | |
|---|---|---|---|---|
| 6,246,557 | B1* | 6/2001 | Bayer | H03K 17/063 361/86 |
| 6,275,395 | B1* | 8/2001 | Inn | H03K 17/0822 363/60 |
| 6,400,203 | B1* | 6/2002 | Bezzi | H03K 17/0822 327/309 |
| 9,467,136 | B1* | 10/2016 | Nguyen | H03K 17/0822 |
| 2005/0127988 | A1* | 6/2005 | Ozasa | H03F 3/345 327/543 |
| 2017/0012617 | A1* | 1/2017 | Moctezuma | H02H 3/087 |

* cited by examiner

*Primary Examiner* — John W Poos
*Assistant Examiner* — Tyler J Pereny
(74) *Attorney, Agent, or Firm* — Ray A. King; Frank D. Cimino

(57) ABSTRACT

A load switch includes a switch input, a switch output, a first field-effect transistor (FET), and a second FET. The switch input is adapted to be coupled to a controller output of a controller. The switch output is adapted to be coupled to a controller input of the controller. The first FET has a gate and a source. The gate of the first FET is coupled to the switch input. The second FET has a gate and a source. The gate of the second FET is coupled to the source of the first FET. The source of the second FET is coupled to the switch output.

16 Claims, 8 Drawing Sheets

FAULT VOLTAGE SCALING ON LOAD SWITCH CURRENT SENSE

CROSS-REFERENCE TO RELATED APPLICATIONS

The present application claims priority to U.S. Provisional Patent Application No. 63/193,490, which was filed May 26, 2021, is titled "Fault Voltage Scaling on High Side Switch Current Sense To Protect ADCs," and is hereby incorporated herein by reference in its entirety.

BACKGROUND

A load switch such as a high-side switch is a circuit, component or device regulates power delivery from a power source to a load based on a control signal provided by a controller. The load switch can include a pass transistor or other switching device coupled between the power source and the load. The load switch is configured to, responsive to the control signal being a first level (e.g., a high level), activate the pass transistor to allow current flow from the power source to the load. The load switch is configured to, responsive to the control signal being a second level (e.g., a low level), deactivate the pass transistor to prohibit current flow from the power source to the load. The load switch can output a sense current that is proportional to a level of current flowing through the pass transistor. A voltage can be provided to an analog-to-digital converter (ADC) of the controller based on the sense current.

SUMMARY

In accordance with at least one example of the description, a load switch includes a switch input, a switch output, a first field-effect transistor (FET), and a second FET. The switch input is adapted to be coupled to a controller output of a controller. The switch output is adapted to be coupled to a controller input of the controller. The first FET has a gate and a source. The gate of the first FET is coupled to the switch input. The second FET has a gate and a source. The gate of the second FET is coupled to the source of the first FET. The source of the second FET is coupled to the switch output.

DETAILED DESCRIPTION

Figure 1:
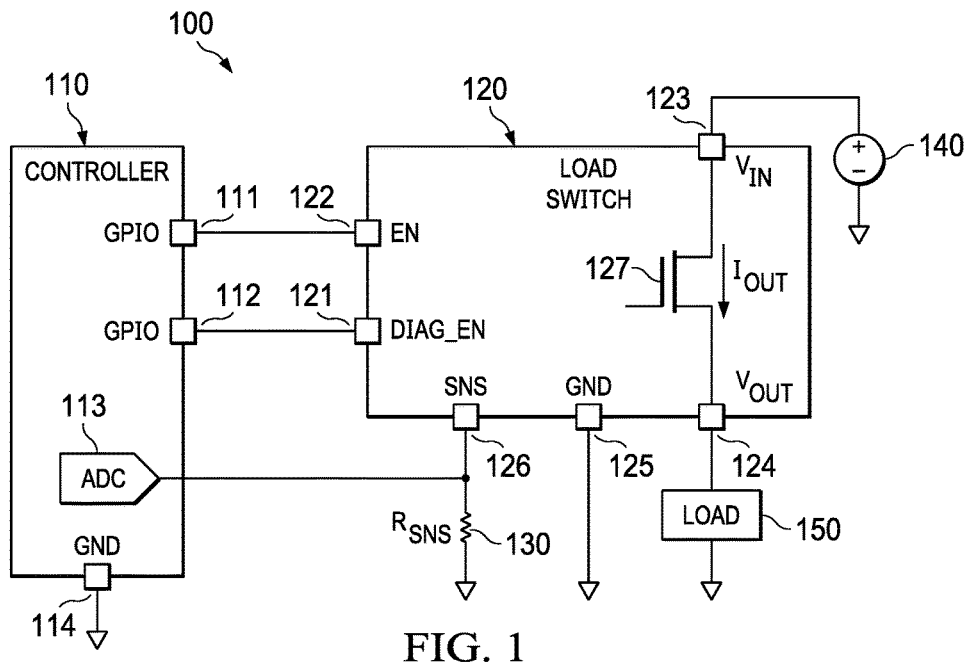
FIG. 1 is a block diagram of an example system for power delivery.

Voltages provided to an analog-to-digital converter (ADC) of a controller by a load switch based on sense current can exceed a range of voltages that the ADC can support for a number of reasons. In some instances, a fault condition can exist in which a level of current flowing through a pass transistor of the load switch increases such that it exceeds a determined current limit. Being proportional to the level of current flowing through the pass transistor, a sense current of the load switch can likewise increase. That increased sense current can be multiplied by a value of a sense resistor adapted to be coupled to an output of the load switch to provide a fault voltage indicative of the fault condition to the ADC. If the resistance value of the sense resistor is excessively large (e.g., 100 kiloohms), a fault current indicative of the fault condition exists at the sense resistor, or the sense resistor is open, the fault voltage can exceed the range of voltages that the ADC can support and damage the ADC.

One approach to avoid providing an ADC of a controller with voltages that exceed a range of voltages that the ADC can support involves coupling a shunt Zener diode between a sense (SNS) output of a load switch and the ADC. The shunt Zener diode can clamp voltages that the load switch provides to a voltage level within the range of voltages that the ADC can support. While effective, adding external components (e.g., shunt Zener diodes) to avoid providing an ADC with voltages that exceed a range of voltages that the ADC supports increases both component costs and system size. Another such approach involves integrating a voltage clamp within a load switch such that the load switch outputs a fixed voltage responsive to a fault condition rather than a sense current indicative of the fault condition. However, a fixed voltage that may be acceptable for an ADC of a controller configured for one level of voltage operation (e.g., 5-volt operation) may also damage an ADC of a controller configured for another level of voltage operation (e.g., 3.3-volt operation).

Aspects of this description relate to a load switch that includes integrated pin-to-pin clamping functionality to avoid providing an ADC with voltages that exceed a range of voltages that the ADC supports. In at least one example, a pin-to-pin clamping circuit of the load switch is configured to control a voltage that a switch output provides to an ADC of a controller based on a voltage that a switch input receives from an output of the controller. Accordingly, the pin-to-pin clamping circuit avoids outputting voltages that exceed the range of voltages that the ADC support without adding external components. Component cost and system size increases associated with such external components can be avoided. Furthermore, controlling or scaling voltages output to a controller with voltages received from that controller provides the load switch with the flexibility to concurrently support controllers that are configured to support different voltage operations (e.g., 3.3-volt operation and 5-volt operation).

FIG. 1 is a block diagram of an example system 100 for power delivery. At least some implementations of the system 100 are representative of an application environment for a load switch with fault sense voltage scaling for analog-to-digital converter (ADC) protection. The system 100 can include a controller 110 that includes a first general-purpose input/output (GPIO) 111, a second GPIO 112, an ADC 113, and a ground interface 114. The system 100 can also include a load switch 120 that includes a diagnostics enable-disable (DIAG_EN) input 121, a channel activation control (EN)

input 122, an input voltage ($V_{IN}$) interface 123, an output voltage ($V_{OUT}$) interface 124, a ground interface 125, a sense (SNS) output 126, and a pass transistor or other switching device, such as a field-effect transistor (FET) 127, a metal-oxide-semiconductor field-effect transistor (MOSFET), or a bipolar junction transistor (BJT). The system 100 can also include a sense resistor ($R_{SNS}$) 130 that is adapted to be coupled to the SNS output 126, a power source 140 that is adapted to be coupled to the $V_{IN}$ interface 123, and a load 150 that is adapted to be coupled between the $V_{OUT}$ interface 124 and ground.

In an example operation of the system 100, an enable signal provided by the first GPIO 111 is received at the EN input 122. The load switch 120 is configured to, responsive to the enable signal having a first voltage level (e.g., a high-level voltage), activate the FET 127. Responsive to the FET 127 being activated, a current ($I_{OUT}$) flows from the $V_{IN}$ interface 123 to the $V_{OUT}$ interface 124 such that power is delivered from the power source 140 to the load 150. The load switch 120 is configured to, responsive to the enabling signal having a second voltage level (e.g., a low-level voltage), deactivate the FET 127. Responsive to the FET 127 being deactivated, $I_{OUT}$ ceases to flow from the $V_{IN}$ interface 123 to the $V_{OUT}$ interface 124 such that power delivery from the power source 140 to the load 150 is eliminated. A diagnostic signal provided by the second GPIO 112 is received at the DIAG_EN input 121. The load switch 120 is configured to, responsive to the diagnostic signal having a first voltage level (e.g., a high-level voltage), enable diagnostic functionalities (e.g., current sensing functionalities and/or fault reporting) of the load switch 120. Responsive to the diagnostic functionalities of the load switch 120 being enabled, a sense current ($I_{SNS}$) that is proportional to $I_{OUT}$ can flow from the SNS output 126 to ground via $R_{SNS}$ 130 and a voltage ($V_{SNS}$) exists at the SNS output 126. The SNS output 126 is configured to provide $V_{SNS}$ to the ADC 113 such that the controller 110 receives feedback regarding a value of $I_{OUT}$. The load switch 120 is configured to, responsive to the diagnostic signal having a second voltage level (e.g., a high-level voltage), disable diagnostic functionalities (e.g., current sensing functionalities and/or fault reporting) of the load switch 120.

Figure 2:
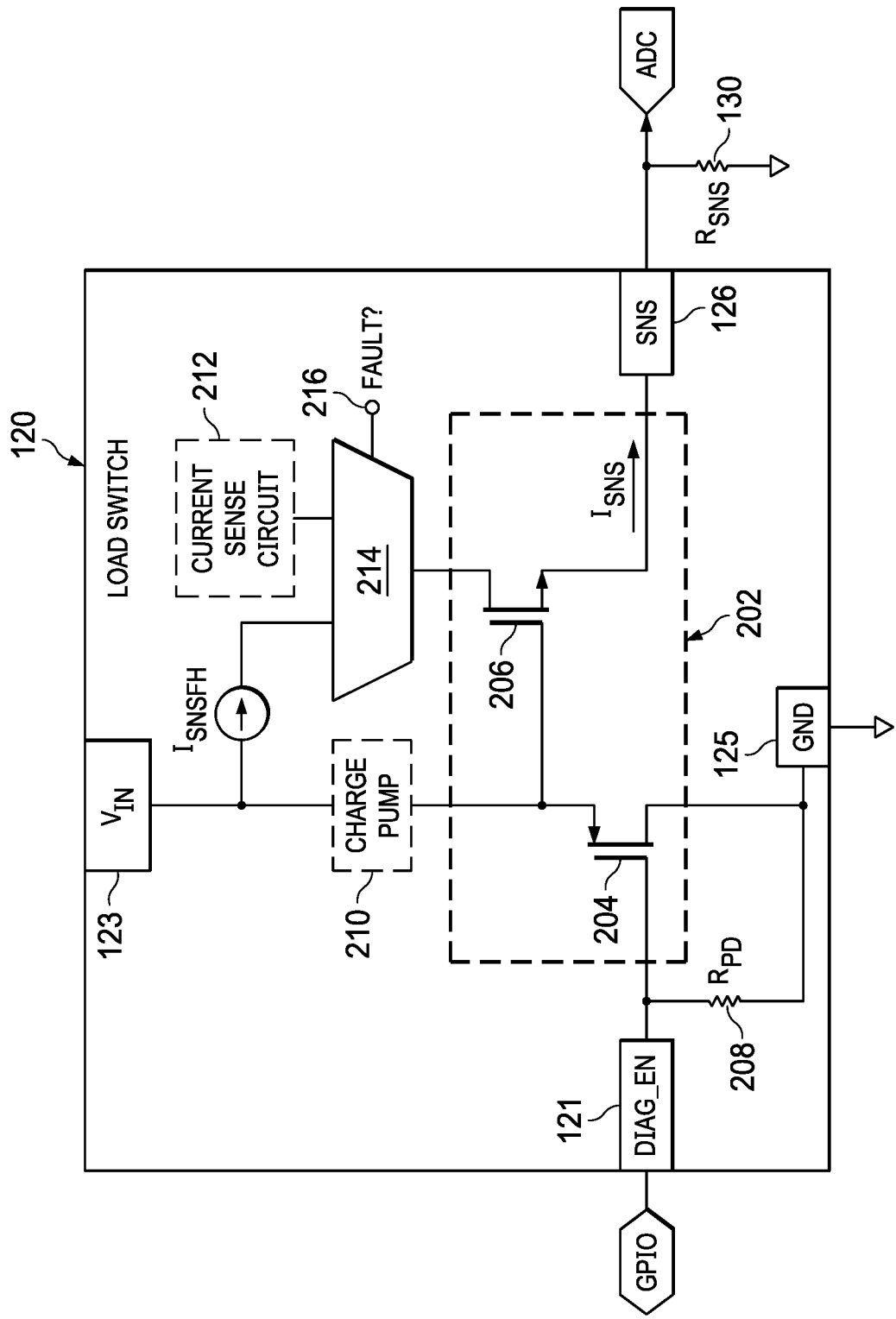
FIG. 2 is a block diagram of an example implementation of the load switch with a pin-to-pin clamping circuit.

FIG. 2 is a block diagram of an example implementation of the load switch 120. In at least some examples, the load switch 120 can include a pin-to-pin clamping circuit 202 that includes a p-type FET (PFET) 204 and an n-type FET (NFET) 206. The load switch 120 can also include a pull-down resistor ($R_{PD}$) 208, a charge pump 210, a current sense circuit 212, a multiplexer (MUX) 214, and a fault state input 216. In an example architecture of the load switch 120, a gate of the PFET 204 is adapted to be coupled to the DIAG_EN input 121 and a first terminal of $R_{PD}$ 208. A source of the PFET 204 is adapted to be coupled to a charge pump output of the charge pump 210 and a gate of the NFET 206. A drain of the PFET 204 is adapted to be coupled to the ground interface 125. A source of the NFET 206 is adapted to be coupled to the SNS output 126 and a drain of the NFET 206 is adapted to be coupled to a first MUX output of the MUX 214. A second terminal of the $R_{PD}$ 208 is adapted to be coupled to the ground interface 125. $R_{PD}$ 208 is configured to facilitate providing a gate voltage to the gate of the PFET 204. The charge pump 210 has a charge pump input that is adapted to be coupled to the $V_{IN}$ interface 123 and a first MUX input of the MUX 214. The charge pump 210 is configured to facilitate activating the FET 127 of the load switch 120. The current sense circuit 212 has a current sense output that is adapted to be coupled to a second MUX input of the MUX 214 and is configured to provide a current that is proportional to $I_{OUT}$. The MUX 214 has a third MUX input that is adapted to be coupled to the fault state input 216. A fault signal exists at the fault state input 216 responsive to internal circuitry of the load switch 120 determining that a fault condition exists.

The clamping circuit 202 is configured to control a voltage ($V_{SNS}$) provided at the SNS output 126 based on a voltage ($V_{DIAG\_EN}$) existing at the DIAG_EN input 121. As described above, the DIAG_EN input 121 and the SNS output 126 are adapted to be coupled to the GPIO 111 and the ADC 113 of the controller 110, respectively. Because the GPIO 111 and the ADC 113 are both components of the controller 110, an output high voltage ($V_{OH}$) provided by the GPIO 111 is close or substantially close to an upper voltage limit ($V_{ADC,max}$) of a range of voltages that the ADC 113 can support. Accordingly, $V_{OH}$ is useful to facilitate clamping $V_{SNS}$ in a manner that avoids exceeding $V_{ADC,max}$. $V_{DIAG\_EN}$ can similarly be useful to facilitate clamping $V_{SNS}$ in a manner that avoids exceeding $V_{ADC,max}$ to the extent that $V_{OH}$ represents an upper voltage limit of a range of voltages that may exist at the DIAG_EN input 121.

In operation, the DIAG_EN input 121 is configured to provide $V_{DIAG\_EN}$ to the gate of the PFET 204. The source of the PFET 204 is configured to, responsive to $V_{DIAG\_EN}$ existing at the gate of the PFET 204, provide a source voltage ($V_{S,\ P1}$) to the gate of the NFET 206. A maximum value of $V_{S,\ P1}$ can be determined according to $V_{DIAG\_EN}+V_{GS,\ P1}$, where $V_{GS,\ P1}$ is a threshold voltage of the PFET 204. $V_{GS,\ P1}$ can be added to $V_{DIAG\_EN}$ by operation of the PFET 204. The source of the NFET 206 is configured to, responsive to $V_{S,\ P1}$ being present on the gate of the NFET 206, provide a source voltage ($V_{S,\ N1}$) to the SNS output 126. A maximum value of $V_{S,\ N1}$ can be determined according to $V_{DIAG\_EN}+V_{GS,P1}-V_{GS,\ N1}$ where $V_{GS,\ N1}$ is a threshold voltage of the NFET 206. $V_{GS,\ N1}$ can be subtracted from $V_{S,\ P1}$ by operation of the NFET 206. Responsive to $V_{GS,\ P1}$ being approximately equal to $V_{GS,\ N1}$, the maximum value of $V_{S,\ N1}$ is approximately equal to $V_{DIAG\_EN}$ such that a maximum value of $V_{SNS}$ ($V_{SNSFH}$) exists at the SNS output 126 if a fault condition exists (e.g., $I_{OUT}$ is greater than or equal to a determined current limit) is effectively clamped to the voltage, $V_{DIAG\_EN}$, that exists at the DIAG_EN input 121. If a normal operational condition exists (e.g., $I_{OUT}$ is less than a determined current limit), a $V_{SNS}$ is proportional to $I_{OUT}$.

Figure 3:
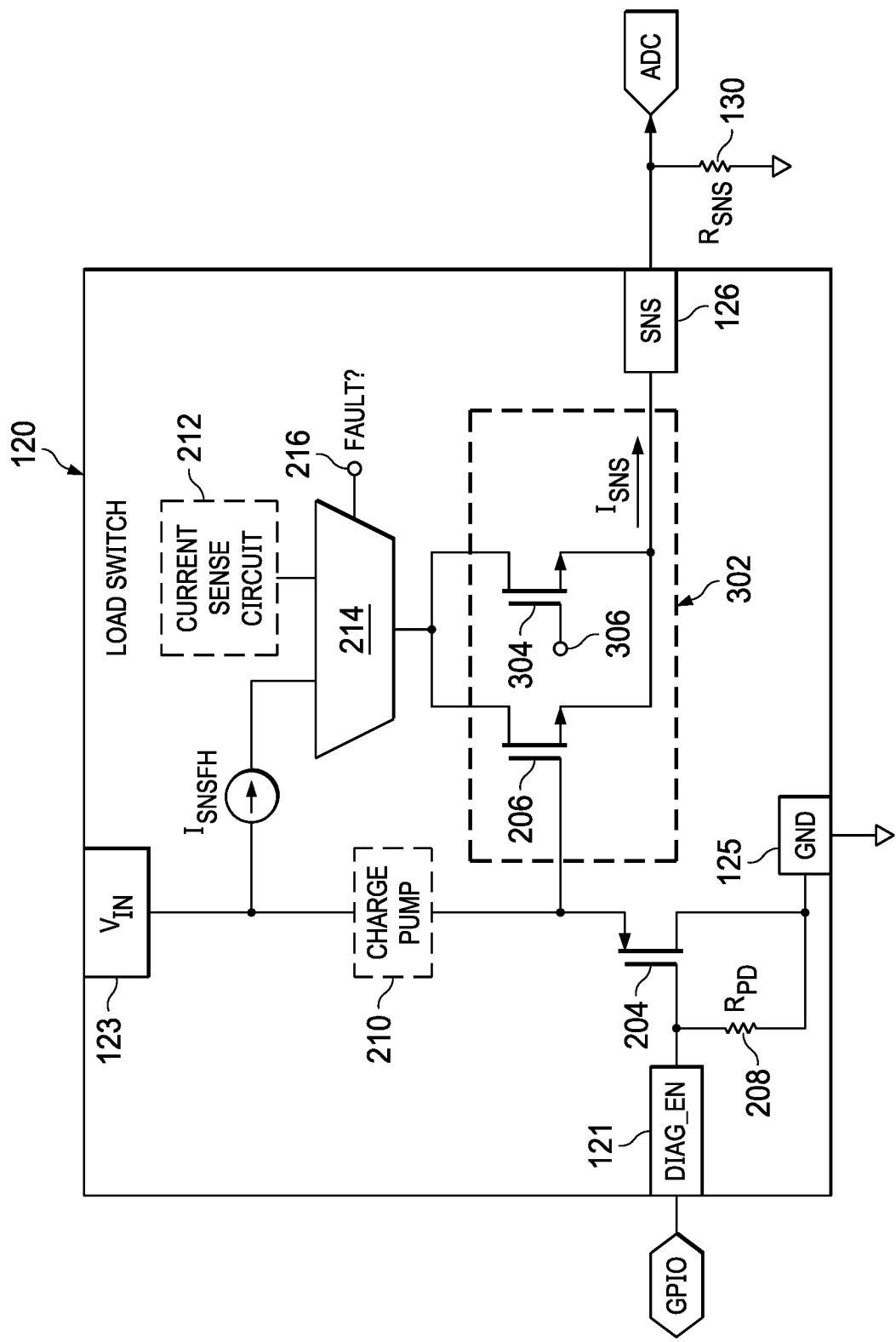
FIG. 3 is a block diagram of an example implementation of the load switch with a baseline fault voltage clamping circuit.

FIG. 3 is a block diagram of an example implementation of the load switch 120. In at least some examples, the load switch 120 can include a baseline fault voltage clamping circuit 302 that includes the NFET 206, an NFET 304, and a baseline selection input 306. In an example architecture of the load switch 120, a gate of the NFET 304 is adapted to be coupled to the baseline selection input 306, a source of the NFET 304 is adapted to be coupled to the SNS output 126, and a drain of the NFET 304 is adapted to be coupled to the first MUX output of the MUX 214.

As described above, the clamping circuit 202 shown in FIG. 2 is configured to control $V_{SNS}$ based on $V_{DIAG\_EN}$ to facilitate clamping $V_{SNS}$ in a manner that avoids exceeding $V_{ADC,max}$. In some instances, a value of $V_{DIAG\_EN}$ may be less than a lower voltage limit ($V_{ADC,min}$) of the range of voltages that the ADC 113 can support. For example, a conductive path that is adapted to be coupled between the GPIO 111 of the controller 110 and the DIAG_EN input 121 may include one or more parasitic elements that reduce a value of $V_{DIAG\_EN}$ existing at the DIAG_EN input 121. While the value of $V_{DIAG\_EN}$ may exceed an input voltage high-level ($V_{IH,DIAG\_EN}$) of the DIAG_EN input 121, that value of $V_{DIAG\_EN}$ may fall within a predetermined range of values that the controller 110 interprets as being indicative of normal operation. In such instances, the load switch 120 can properly interpret that value of $V_{DIAG\_EN}$ as indicative of a logic high while a value of $V_{SNS}$ that is approximately identical to that value of $V_{DIAG\_EN}$ would be unusable by the ADC 113 because a value of $V_{SNSFH}$ based on $V_{DIAG\_EN}$ that indicates a fault condition would fall within the predetermined range of values indicative of normal operation.

The clamping circuit 302 is configured to control $V_{SNSFH}$ based on $V_{DIAG\_EN}$ and a voltage ($V_{BLN}$) existing at the baseline selection input 306 to facilitate clamping $V_{SNSFH}$ to a voltage level that is proximate to $V_{ADC,max}$ without exceeding $V_{ADC,max}$. Stated differently, the clamping circuit 302 is configured to, responsive to $V_{DIAG\_EN}$ transitioning below a threshold voltage level (e.g., $V_{ADC,max}$), control $V_{SNSFH}$ to the threshold voltage level. To that end, the NFET 206 and the NFET 304 are adapted to be coupled in parallel between the first MUX output of the MUX 214 and the SNS output 126. If $V_{DIAG\_EN}$ is greater than a difference between $V_{BLN}$ and a threshold voltage ($V_{GS,\ N2}$) of the NFET 304 (e.g., $V_{BLN}-V_{GS,\ N2}$), $V_{SNSFH}$ is set to $V_{DIAG\_EN}$. Similarly, if the difference $V_{BLN}$ and $V_{GS,\ N2}$ is greater than $V_{DIAG\_EN}$, $V_{SNSFH}$ is set to the difference between $V_{BLN}$ and $V_{GS,\ N2}$. As such, the $V_{BLN}$ is useful to the clamping circuit 302 for defining the threshold voltage level to which the clamping circuit 302 controls $V_{SNSFH}$ responsive to $V_{DIAG\_EN}$ transitioning below that threshold voltage level. For example, the controller 110 may be configured for 3.3 V operation. In this example, a lower voltage limit of $V_{SNSFH}$ can be approximately 3.3 V if approximately 3.6 V exists at the baseline selection input 306 and $V_{t,\ N2}$ is approximately 0.3 V.

Figure 4:
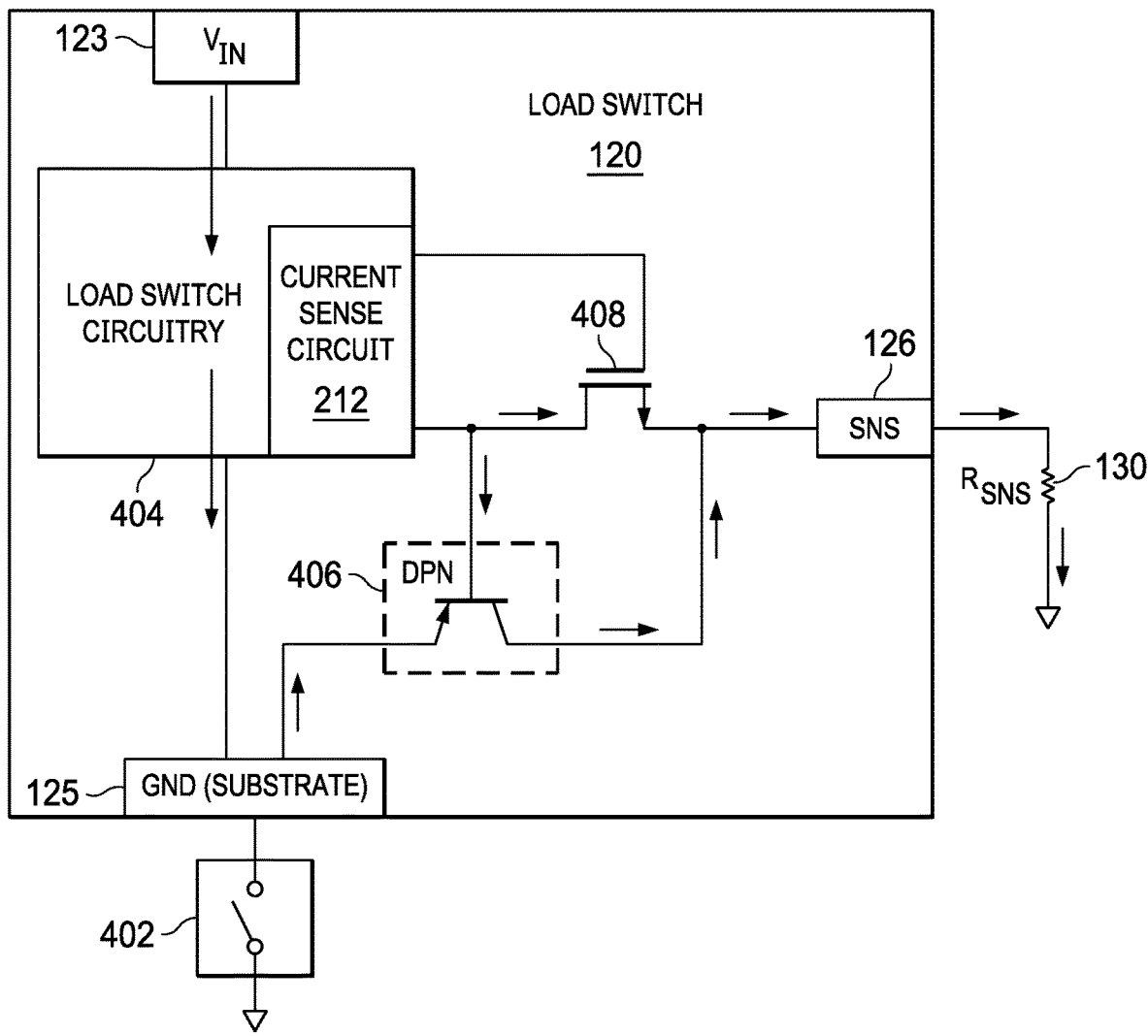
FIG. 4 is a block diagram of an example parasitic current path within the load switch during a ground loss event.

FIG. 4 is a block diagram of an example parasitic current path within the load switch 120 during a ground loss event. Various ground loss events can negatively impact operation of the load switch 120. One example of a ground loss event can occur responsive to multiple elements (e.g., the controller 110, the load switch 120, and the load 150) of the system 100 being decoupled from ground. Another example of a ground loss event 402 shown in FIG. 4 can occur responsive to the ground interface 125 of the load switch 120 being decoupled from ground. FIG. 4 shows that a parasitic current path within the load switch 120 can exist during the ground loss event 402. For example, current can flow from the $V_{IN}$ interface 123 to the ground interface 125 via load switch circuitry 404 that can include the current sense circuit 212. A parasitic PNP-type bipolar junction transistor (parasitic transistor) 406 can be formed by a p-substrate of the ground interface 125, an N buried layer of the ground interface 125, a deep N well of the ground interface 125, and a surface P well of the ground interface 125. In FIG. 4, the NFET 206 and the NFET 304 are collectively represented by an NFET 408.

An emitter of the parasitic transistor 406 is adapted to be coupled to the p-substrate of the ground interface 125, a base of the parasitic transistor 406 is adapted to be coupled to a drain (e.g., the respective drains of the NFET 206 and the NFET 304) of the NFET 408, and a collector of the parasitic transistor 406 is adapted to be coupled between a source (e.g., the respective sources of the NFET 206 and the NFET 304) of the NFET 408 and the SNS output 126. If a current sensing functionality of the load switch 120 is disabled, a gate (e.g., the respective gates of the NFET 206 and the NFET 304) of the NFET 408 is shorted to the ground interface 125. During the ground loss event 402, the ground interface 125 can float high. Because the gate of the NFET 408 is shorted to the ground interface 125, current can flow through the NFET 408 if the current sensing functionality of the load switch is disabled. However, if the current sensing functionality of the load switch 120 is enabled, the NFET 408 can be activated (e.g., turned on) responsive to $V_{EN}$. Responsive to current being present on the base of the parasitic transistor 406, current can directly flow from the ground interface 125 to the SNS output 126 via the parasitic transistor 406. In effect, the ground interface 125 would have a parasitic current path provided by the parasitic transistor 406 to ground via the SNS output 126 and the $R_{SNS}$ 130. The ground interface 125 would no longer float high with that parasitic current path. Instead, the ground interface 125 would be clamped to a voltage that includes a combination of a diode voltage of the parasitic transistor 406 and $V_{SNS}$. Stated differently, a quiescent current of the load switch 120 is multiplied by a value of the $R_{SNS}$ 130 to set a value of $V_{SNS}$ during the ground loss event 402. In that instance, a voltage level existing at the ground interface 125 would be that value of $V_{SNS}$ plus a forward voltage of a base-emitter junction of the parasitic transistor 406.

Figure 5:
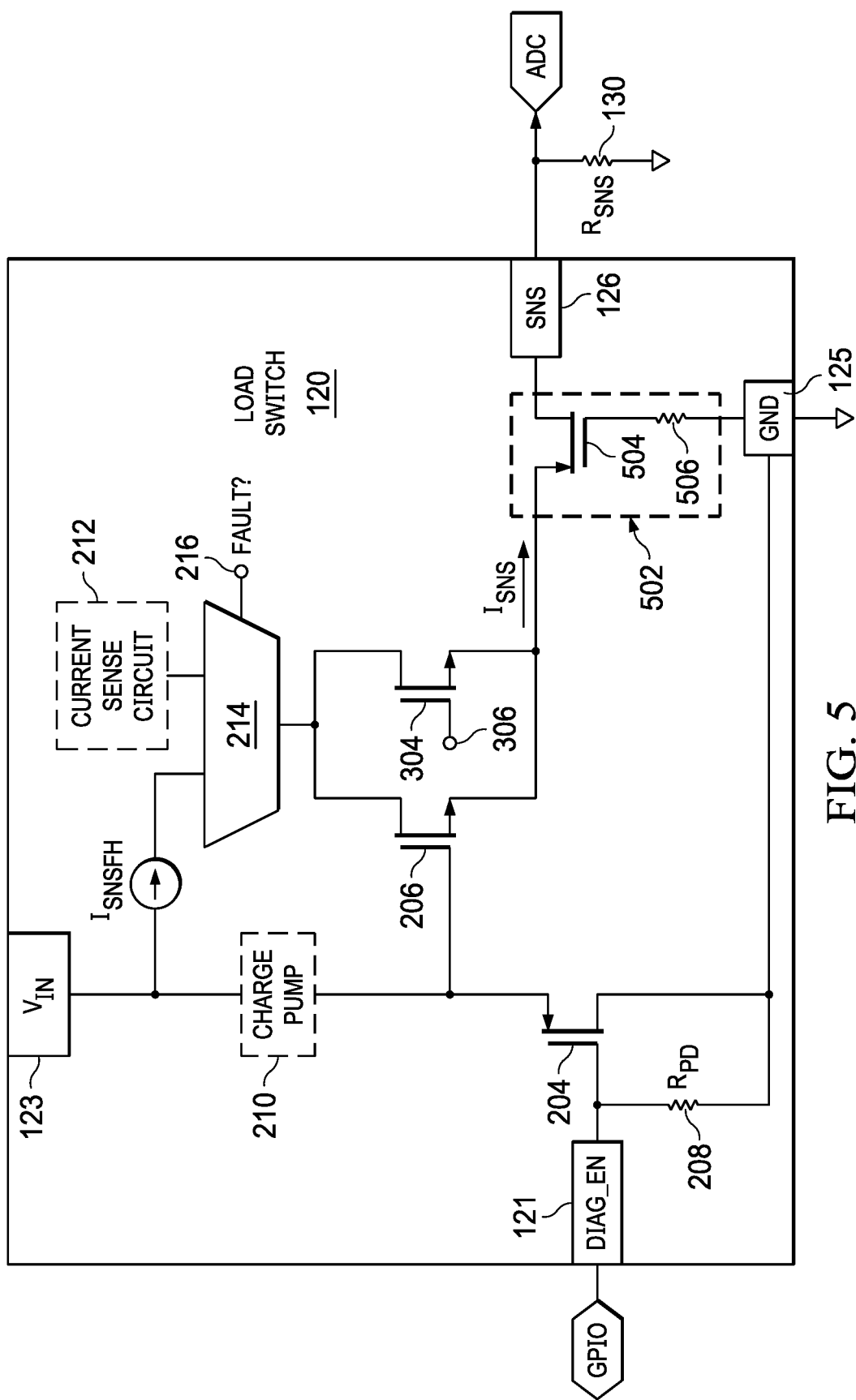
FIG. 5 is a block diagram of an example implementation of the load switch with a ground loss circuit.

FIG. 5 is a block diagram of an example implementation of the load switch 120. In at least some examples, the load switch 120 can include a ground loss circuit 502 that includes a PFET 504 and a resistor 506. In an example architecture of the load switch 120, a gate of the PFET 504 is adapted to be coupled to a first terminal of the resistor 506, a source of the PFET 504 is adapted to be coupled to the respective sources of the NFET 206 and the NFET 304, and a drain of the PFET 504 is adapted to be coupled to the SNS output 126. A second terminal of the resistor 506 is adapted to be coupled to the ground interface 125. The ground loss circuit 502 is configured to, responsive to a ground loss event (e.g., ground loss event 402 of FIG. 4) disconnect the SNS output 126. To that end, the PFET 504 is adapted to be coupled in series between the SNS output 126 and the respective sources of the NFET 206 and the NFET 304. If the ground interface 125 is coupled to ground, a ground potential is present on the gate of the PFET 504 and the PFET 504 is in an "ON" state. Responsive to the PFET 504 being in the "ON" state, a current path is provided between the SNS output 126 and the respective sources of the NFET 206 and the NFET 304. If a ground loss event occurs (e.g., the ground interface 125 becomes decoupled from ground), $V_{IN}$ is present on the gate of the PFET 504 and the PFET 504 transitions from the "ON" state to an "OFF" state. Responsive to the PFET 504 being in the "OFF" state, the current path between the SNS output 126 and the respective sources of the NFET 206 and the NFET 304 is blocked or eliminated.

Figure 6:
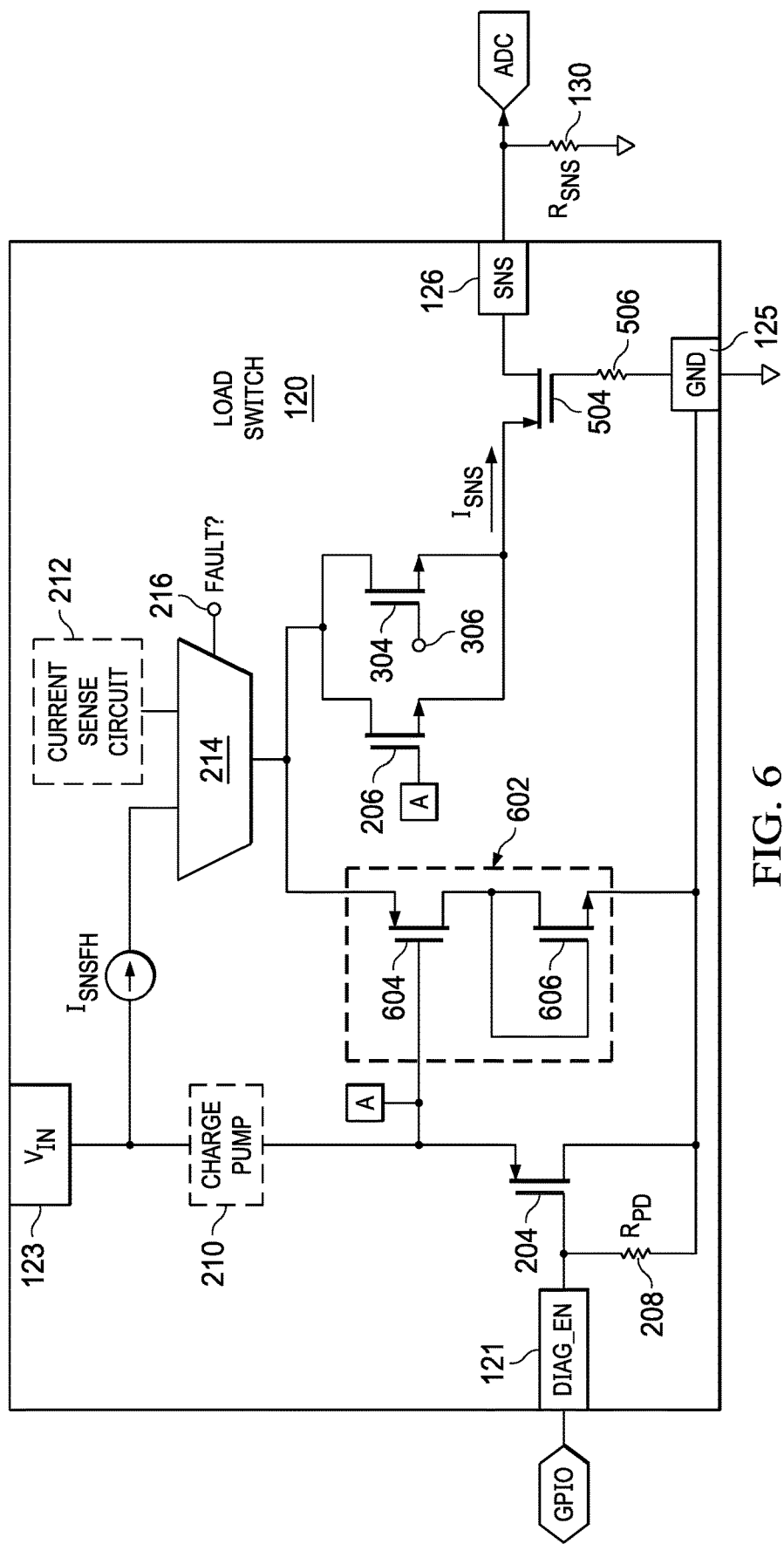
FIG. 6 is a block diagram of an example implementation of the load switch with a source-follower circuit.

FIG. 6 is a block diagram of an example implementation of the load switch 120. In at least some examples, the load switch 120 can include a source-follower circuit 602 that includes a PFET 604 and an NFET 606. In an example architecture of the load switch 120, a gate of the PFET 604 is adapted to be coupled to the source of the PFET 204 and to the gate of the NFET 206. A source of the PFET 604 is adapted to be coupled between the drain of the NFET 206, the drain of the NFET 304, and the first MUX output of the MUX 214. A drain of the PFET 604 is adapted to be coupled between a drain of the NFET 606 and a gate of the NFET 606. A source of the NFET 606 is adapted to be coupled to the ground interface 125.

In FIG. 6, a current path (current sense path) for $I_{SNS}$ to the SNS output 126 can be provided by internal components (e.g., NFET 206, NFET 304, and/or PFET 504) of the load switch 120. Voltages (e.g., a voltage existing at node 608)

existing on the current sense path are proportional to a resistance value of $R_{SNS}$ 130. In some instances, the resistance value of $R_{SNS}$ 130 can increase to a level (e.g., an infinite resistance value based on $R_{SNS}$ 130 being in an open state) that results in those voltages on the current sense path increasing to values that exceed an upper voltage limit of a range of voltages that internal components (e.g., NFET 206, NFET 304, and/or PFET 504) of the load switch 120 can support. In such instances, the resulting increased values of voltages existing on the current sense path (e.g., a voltage existing at node 608) can damage the internal components of the load switch 120.

One approach to reducing a likelihood of damage arising from voltages of the current sense path exceeding an upper voltage limit of a range of voltages that internal components of the load switch 120 can support is to increase that upper voltage limit. This approach can involve implementing one or more FETs (e.g., NFET 206, NFET 304, and PFET 504) of the load switch 120 with FETs having higher voltage ratings to increase the upper voltage limit. While effective, a FET having a higher voltage rating generally costs more and occupies more space than a FET having a lower voltage rating. As such, some negative aspects of this approach can include increased component costs and larger device sizes.

The source-follower circuit 602 provides another approach to reducing a likelihood of damage arising from voltages of the current sense path exceeding an upper voltage limit of a range of voltages that internal components of the load switch 120 can support. To that end, the source-follower circuit 602 is configured to, responsive to voltages of the current sense path (e.g., a voltage existing at node 608) exceeding a threshold voltage level (e.g., an upper voltage limit of a range of voltages that internal components of the load switch 120 can support), divert, at least, a portion of $I_{SNS}$ to ground. In FIG. 6, a current path for the portion of $I_{SNS}$ to ground can be provided by coupling the source of the PFET 604 to the output of the current sense circuit 212 via the first MUX output of the MUX 214 and coupling the drain of the PFET 604 to a diode connected transistor implemented by the NFET 606. Coupling the gate of the PFET 604 to the gate of the NFET 206 can facilitate modulating the portion of $I_{SNS}$ that the source-follower circuit 602 diverts to ground. Diverting a portion of $I_{SNS}$ to ground with the source-follower circuit 602 can be useful for implementing one or more internal components (e.g., NFET 206, NFET 304, and PFET 504) of the load switch 120 with components having lower voltage ratings. Components having lower voltage ratings generally cost less and occupy less space than components having higher voltage ratings. As such, some positive aspects of implementing the source-follower circuit 602 can include reduced component costs and smaller device sizes.

In at least one example, a resistance value of $R_{SNS}$ 130 is bounded by a lower resistance value ($R_{SNS,min}$) and an upper resistance value ($R_{SNS,max}$). $R_{SNS,min}$ may be determined according to $((V_{SNSFH}-V_{HR})*K_{SNS})/I_{LOAD,max}$, where $V_{HR}$ is a headroom voltage, where $K_{SNS}$ is a current sense ratio (e.g., $I_{OUT}/I_{SNS}$), and where $I_{LOAD,max}$ is an upper current limit of a range of load current values that are measurable by the controller 110 and/or that are deliverable by the load switch 120. In at least one example, $V_{HR}$ represents a voltage difference between a value of $V_{SNS}$ indicative of $I_{LOAD,max}$ (e.g., $I_{LOAD,max}$*a resistance value of $R_{SNS}$ 130) and $V_{SNSFH}$ to facilitate distinguishing between a normal operational condition and a fault condition. In at least one example, $V_{HR}$ is user configurable. $R_{SNS,max}$ may be determined according to $(V_{ADC,min}*K_{SNS})/I_{LAOD,min}$, where $I_{LOAD,min}$ is a lower current limit of a range of load current values that are measurable by the controller 110. In at least one example, a relationship can exist between $I_{LOAD,min}$ and an error of the current sense circuit 212. For example, $I_{LOAD,min}$ can is the lower current limit of the range of load current values that are measurable by the controller 110, which is a product of the current sensing circuit 212.

Figure 7:
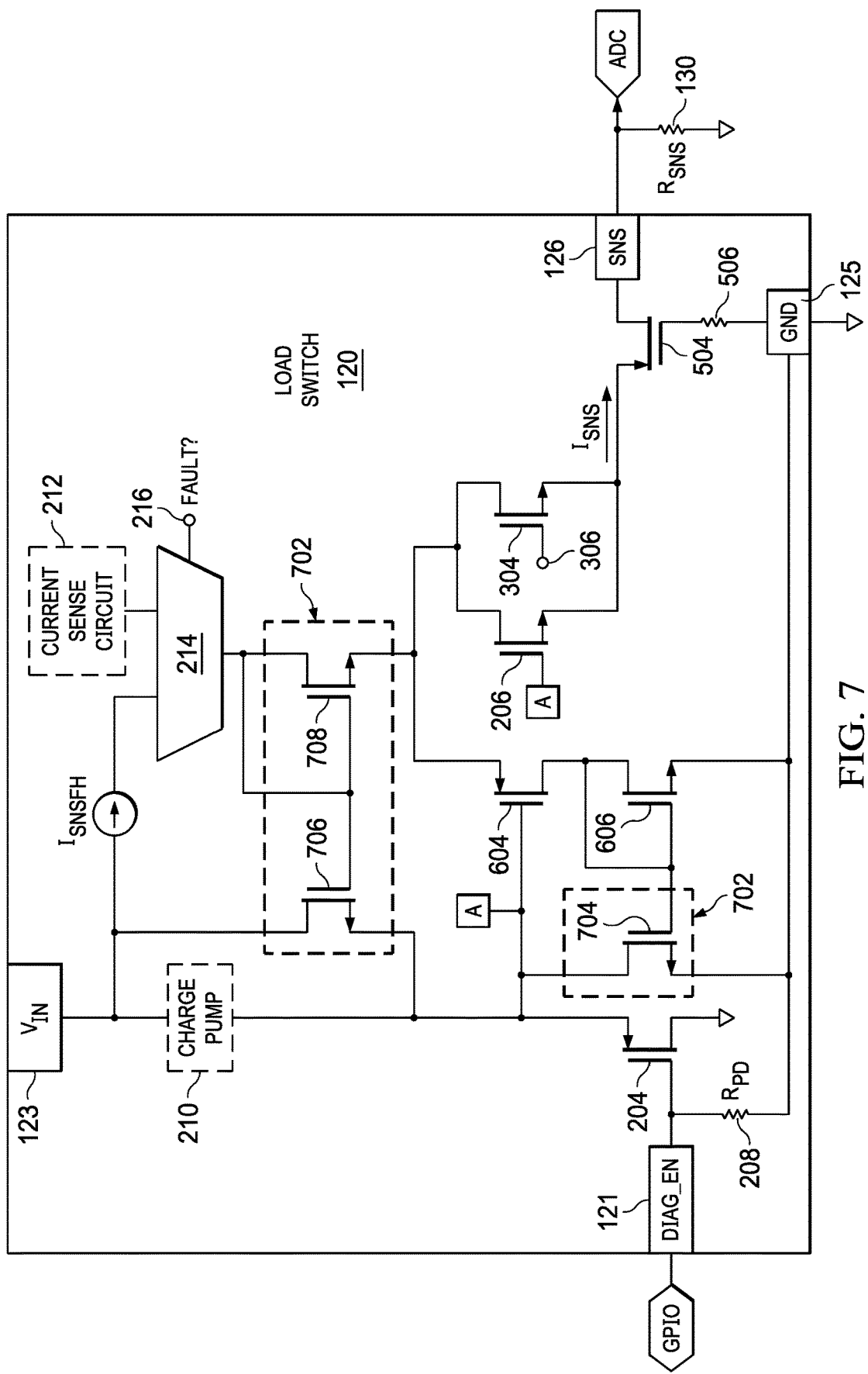
FIG. 7 is a block diagram of an example implementation of the load switch with a sense path variance circuit.

FIG. 7 is a block diagram of an example implementation of the load switch 120. In at least some examples, the load switch 120 can include a sense path variance circuit 702 that includes an NFET 704, an NFET 706, and an NFET 708. In an example architecture of the load switch 120, a gate of the NFET 704 is adapted to be coupled to the gate of the NFET 606, a source of the NFET 704 is adapted to be coupled to the ground interface 125, and a drain of the NFET 704 is adapted to be coupled to the source of the PFET 204. A gate of the NFET 706 is adapted to be coupled to a gate of the NFET 708, a drain of the NFET 708, and/or the first MUX output of the MUX 214. A source of the NFET 706 is adapted to be coupled to the charge pump output of the charge pump 210 and/or the source of the PFET 204. A drain of the NFET 706 is adapted to be coupled to the first MUX input of the MUX 214, the charge pump input of the charge pump 210, and/or the $V_{IN}$ interface 123. A source of the NFET 708 is adapted to be coupled to the drain of the NFET 206, the drain of the NFET 304, and/or the source of the PFET 604.

In operation, a value of $I_{SNS}$ (e.g., the current flowing through the NFET 206 and/or the NFET 304) can vary between approximately a current proportional to an open load current and approximately a fault high-level sense current ($I_{SNSFH}$). Reducing any deviation between a current ($I_{P1}$) flowing through the PFET 204 and $I_{SNS}$ as the value of $I_{SNS}$ varies can facilitate increasing an accuracy of pin-to-pin clamping (e.g., controlling $V_{SNS}$ based on $V_{DIAG\_EN}$) by the clamping circuit 202. As described above, one aspect of pin-to-pin clamping by the clamping circuit 202 involves offsetting $V_{GS,\ P1}$ that is added to $V_{DIAG\_EN}$ by operation of the PFET 204 with $V_{GS,\ N1}$ of the NFET 206.

Responsive to a voltage difference existing between $V_{GS,\ P1}$ and $V_{GS,\ N1}$, an accuracy of the pin-to-pin clamping by the clamping circuit 202 can decrease. For example, $V_{GSS,\ N1}$ may be insufficient to offset $V_{GS,\ P1}$ responsive to $V_{GS,\ N1}$ being less than $V_{GS,\ P1}$. In this example, the clamping circuit 202 can clamp $V_{SNSFH}$ to a value (e.g., $V_{DIAG\_EN}$+the voltage difference between $V_{GS,\ P1}$ and $V_{GSS,\ N1}$) that exceeds $V_{DIAG\_EN}$ if a fault condition exists. If $V_{SNSFH}$ is clamped to the value that exceeds $V_{DIAG\_EN}$, $V_{SNSFH}$ can exceed $V_{ADC,max}$ and damage the ADC 113. As another example, $V_{GS,\ N1}$ may be more than sufficient to offset $V_{GS,\ P1}$ responsive to $V_{GS,\ N1}$ being greater than $V_{GS,\ P1}$. In this example, the clamping circuit 202 can clamp $V_{SNSFH}$ to a value (e.g., $V_{DIAG\_EN}$–the voltage difference between $V_{GS,\ P1}$ and $V_{GS,\ N1}$) that is less than $V_{DIAG\_EN}$ if a fault condition exists. If $V_{SNSFH}$ is clamped to the value that is less than $V_{DIAG\_EN}$, $V_{SNSFH}$ can fall below $V_{HR}$ and impede an ability of the controller 110 to distinguish between a normal operational condition and a fault condition.

Otherwise, responsive to $V_{GS,\ P1}$ and $V_{GS,\ N1}$ being approximately equal, the clamping circuit 202 can clamp $V_{SNSFH}$ to approximately $V_{DIAG\_EN}$ if a fault condition exists. Accordingly, decreasing a voltage difference between $V_{GS,\ P1}$ and $V_{GS,\ N1}$ increases an accuracy of pin-to-pin clamping by the clamping circuit 202. One aspect of decreasing the voltage difference between $V_{GS,\ P1}$ and $V_{GS,\ N1}$ to facilitate increasing an accuracy of that pin-to-pin clamping involves reducing a deviation between $I_{P1}$ and $I_{SNS}$. In load switch 120, the sense path variance circuit 702 is configured to reduce a deviation between $I_{P1}$ and $I_{SNS}$. To that end, the NFET 706 and the NFET 708 are configured to provide a proportional current ($\alpha I$) that is based on a current (I) provided by the current sense circuit 212. With the load switch 120 having the source-follower circuit 602 that includes the PFET 604 and the NFET 606, $I_{SNS}$ is approximately equal to I provided by the current sense circuit 212 reduced by a current ($I_{P2}$) flowing through the PFET 604. The PFET 704 of the sense path variance circuit 702 is adapted to be coupled to the source-follower circuit 602, as shown in FIG. 7, to add a current mirror to the source-follower circuit 602 such that $I_{P1}$ is also reduced by $I_{P2}$.

Figure 8:
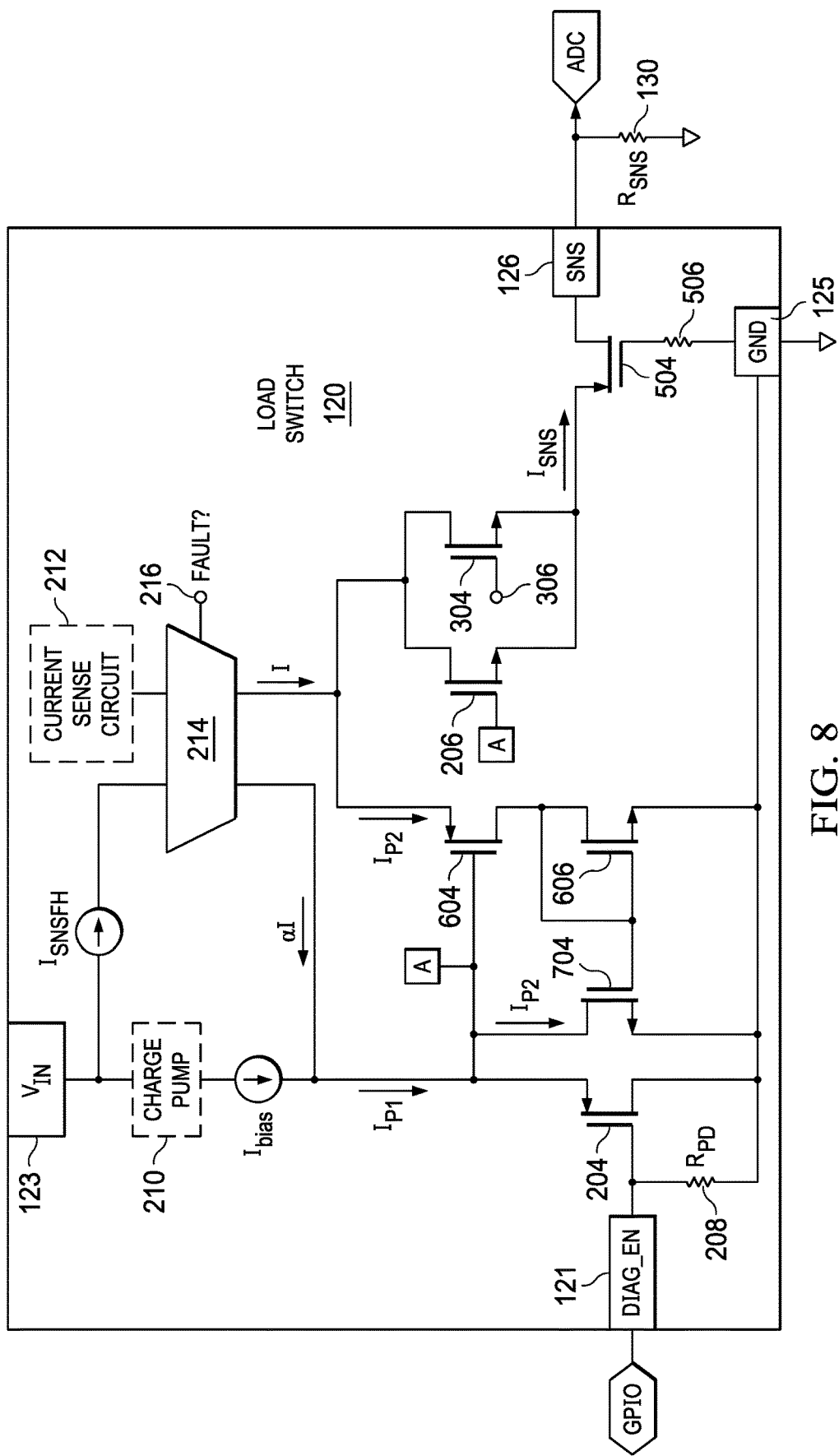
FIG. 8 is a block diagram of an example implementation of the load switch with current matching.

FIG. 8 is a block diagram of an example implementation of the load switch 120 with current matching provided by the sense path variance circuit 702. In FIG. 8, the NFET 706 and the NFET 708 of the sense path variance circuit 702 are represented by a current path for clarity. FIG. 8 shows that current path representation of the NFET 706 and the NFET 708 as being adapted to be coupled between a second MUX output of the MUX 214, the charge pump output of the charge pump 210, and the source of the PFET 204. In at least one example, the second MUX output of the MUX 214 is not an actual output of the MUX 214. In this example, the second MUX output is the first MUX output of the MUX 214 that is shown in FIG. 8 for clarity to visually distinguish between $\alpha I$ (provided by the NFET 706 and the NFET 708) and I provided by the current sense circuit 212. In an example operation of the load switch 120, $I_{P1}$ can be approximately equal to $I_{SNS}$ responsive to currents flowing through the load switch 120 shown in FIG. 8 substantially conforming to the relationship described below in Equation 1:

$$I_{SNS}=I-I_{P2}=I_{P1}=I_{bias}+\alpha I-I_{P2} \quad \text{Equation 1.}$$

Figure 9:
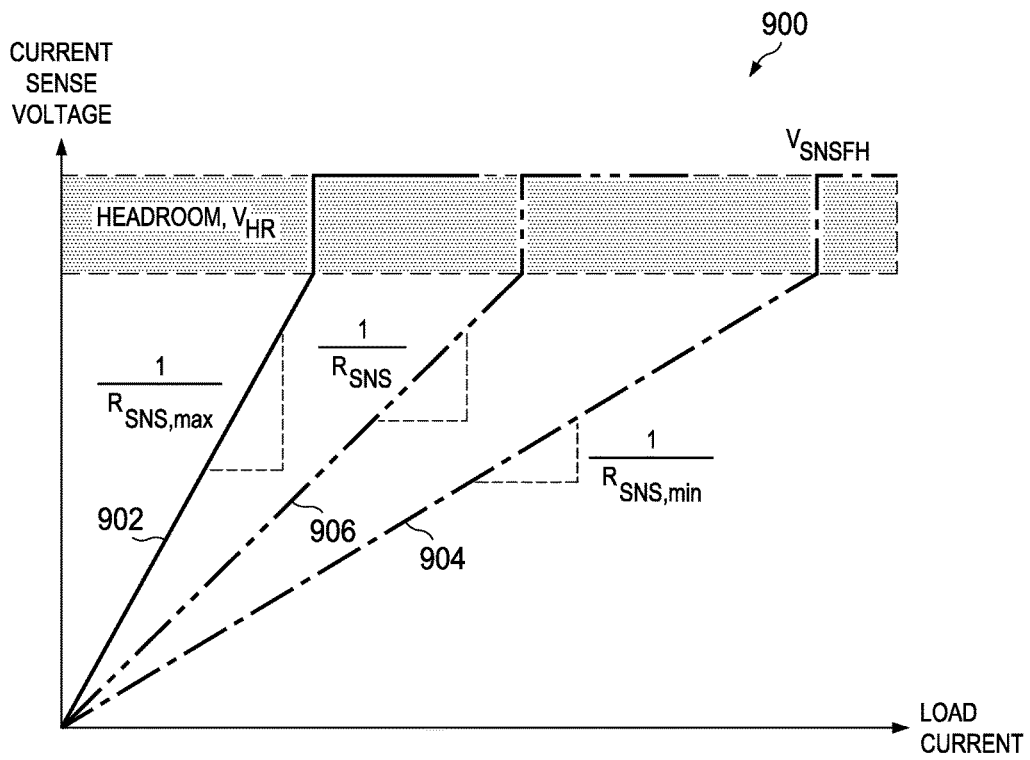
FIG. 9 is a diagram of current sense voltage as a function of load current in the load switch in accordance with various examples.

FIG. 9 is a diagram 900 of current sense voltage, $V_{SNS}$, as a function of load current in the load switch 120 in accordance with various examples. In the diagram 900, $V_{HR}$ represents a voltage difference between a value of $V_{SNS}$ indicative of $I_{LOAD,max}$ and $V_{SNSFH}$ to facilitate distinguishing between a normal operational condition and a fault condition. The diagram 900 includes response curves 902, 904, and 906. Response curve 902 represents values of $V_{SNS}$ existing at the SNS output 126 of the load switch 120 responsive to a resistance value of $R_{SNS}$ 130 being $R_{SNS,max}$. Response curve 904 represents values of $V_{SNS}$ existing at the SNS output 126 of the load switch 120 responsive to a resistance value of $R_{SNS}$ 130 being $R_{SNS,min}$. Response curve 906 represents values of $V_{SNS}$ existing at the SNS output 126 of the load switch 120 responsive to a resistance value of $R_{SNS}$ 130 being between $R_{SNS,max}$ and $R_{SNS,min}$. As shown by the diagram 900, the load switch 120 can provide a full range of current sense voltages to the ADC 113 in a manner that protects the ADC 113 irrespective of a resistance value of $R_{SNS}$ 130. For example, response curves 902, 904, and 906 each continuously extend from a $V_{SNS}$ value of approximately 0 volts to a $V_{SNS}$ value of approximately $V_{SNSFH}$ that clamping circuit 202 sets to avoid exceeding $V_{ADC,max}$, as described above. The diagram 900 also shows that changing the resistance value of $R_{SNS}$ 130 is useful to modify a load current range that is measurable by the full range of current sense voltages provided to the ADC 113. For example, a comparison between response curve 902 and response curve 904 shows that the load current range increases as the resistance value of $R_{SNS}$ 130 decreases from $R_{SNS,max}$ to $R_{SNS,min}$. Increasing the load current range as the resistance value of $R_{SNS}$ 130 decreases can facilitate increasing a resolution of $V_{ADC}$ and/or extending the load current range that is measurable by the controller 110.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A load switch, comprising:
   a switch input terminal coupled to a controller output terminal;
   a switch output terminal coupled to a controller input terminal
   a first field-effect transistor (FET) having a first gate and a first source, wherein the first gate is coupled to the switch input terminal;
   a second FET having a second gate, a second drain and a second source, wherein the second gate is coupled to the first source, and the second source is coupled to the switch output terminal;
   a current sense circuit coupled to the second drain; and
   a multiplexer coupled between the current sense circuit and the second drain.

2. The load switch of claim 1, further comprising:
   a charge pump coupled to the first source.

3. The load switch of claim 1, further comprising:
   a third FET having a third source and a third gate, wherein the third source is coupled to the second source and the switch output terminal.

4. The load switch of claim 1, further comprising:
   A fourth FET having a fourth gate coupled to a ground terminal.

5. The load switch of claim 1, further comprising:
   a source-follower circuit that includes a p-type FET (PFET) having a gate coupled to the first source and to the second gate.

6. The load switch of claim 1, further comprising:
   a current mirror having a current mirror output coupled to the first source.

7. A load switch, comprising:
   a switch input and a switch output, wherein the switch input is coupled to a controller output terminal, and the switch output is coupled to a controller input terminal;
   a first clamp circuit configured to control a voltage at the switch output responsive to a voltage at the switch input, wherein the first clamp circuit includes a first field-effect transistor (FET) coupled to the switch input, and a second FET coupled to the switch output; and
   a second clamp circuit configured to control the voltage at the switch output to a threshold voltage level responsive to the voltage at the switch input transitioning below the threshold voltage level.

8. The load switch of claim 7, further comprising:
   a current sense circuit configured to provide a sense current that is proportional to a load current, wherein the current sense circuit is coupled to a drain of the second FET.

9. The load switch of claim 7, wherein the second clamp circuit includes a third FET, and the threshold voltage level is responsive to a voltage at a gate of the third FET.

10. The load switch of claim 7, further comprising:
    a ground loss circuit configured to disconnect the switch output from the second FET responsive to a ground loss event.

11. The load switch of claim 8, further comprising:
    a source-follower circuit configured to divert a portion of the sense current to ground responsive to the voltage at the switch output exceeding the threshold voltage level.

12. The load switch of claim 8, further comprising:
    a sense path variation circuit configured to reduce a deviation between the sense current and a current flowing through the first FET.

13. A system comprising:
    a controller having a controller input and a controller output;
    a load switch having a switch input and a switch output, wherein the switch input is coupled to the controller output, and the switch output is coupled to the controller input, wherein the load switch includes:
       a first field-effect transistor (FET) having a first gate and a first source, wherein the first gate is coupled to the switch input; and
       a second FET having a second gate and a second source, wherein the second gate is coupled to the first source, and the second source is coupled to the switch output; and
    a clamp circuit that is configured to control a voltage at the switch output to a threshold voltage level responsive to a voltage at the switch input transitioning below the threshold voltage level.

14. The system of claim 13, further comprising a clamp circuit that includes the first and second FETs, wherein the clamp circuit is configured to control a voltage at the switch output responsive to a voltage at the switch input.

15. The system of claim 13, wherein the load switch includes a ground loss circuit configured to disconnect the switch output from the second FET responsive to a ground loss event.

16. The system of claim 13, wherein the load switch includes a source-follower circuit with a p-type FET having a gate that is connected to the first source and the second gate.

* * * * *